United States Patent [19]

Kurosawa

[11] Patent Number: 5,523,675
[45] Date of Patent: Jun. 4, 1996

[54] METHOD AND AN APPARATUS FOR DETECTING A FREQUENCY OF A POWER SYSTEM

[75] Inventor: Yasuhiro Kurosawa, Tokyo, Japan

[73] Assignee: Kabushiki Kaisha Toshiba, Kawasaki, Japan

[21] Appl. No.: 215,575

[22] Filed: Mar. 22, 1994

[30] Foreign Application Priority Data

Mar. 25, 1993 [JP] Japan .................................. 5-090776

[51] Int. Cl.$^6$ ............................................... G01R 23/15
[52] U.S. Cl. .................... 324/76.24; 324/76.39; 364/484
[58] Field of Search .................. 324/76.39, 76.41, 324/76.21, 76.24, 76.42; 361/20, 21; 364/484

[56] References Cited

U.S. PATENT DOCUMENTS

| | | | |
|---|---|---|---|
| 4,437,057 | 3/1984 | Suzuki et al. | 324/76.39 |
| 4,547,726 | 10/1985 | Premerlani | 324/76.39 |
| 4,577,254 | 3/1986 | Yamaura | 361/80 |
| 4,779,044 | 10/1989 | Sklonick et al. | 324/76.39 |
| 5,122,731 | 6/1992 | Cole | 324/76.26 |
| 5,420,501 | 5/1995 | Matsuoka | 324/76.21 |

FOREIGN PATENT DOCUMENTS

| | | |
|---|---|---|
| 0371192 | 6/1990 | European Pat. Off. . |
| 320969 | 3/1985 | Japan . |

OTHER PUBLICATIONS

G. Benmouyal, An Adaptive Sampling–Interval Generator for Digital Relaying IEEE Transaction on Power Delivery, vol. 4, No. 3, p. 1602, Jul. 1989.

Denki Keisan, Nov. 1983, vol. 51, p. 49, Equations (3) and (4).

International Journal of Electronics, vol. 61, No. 4, Oct. 1986, pp. 487–496, Ahmad I. ABU–EL–HAIJA, "Fast Detection of Amplitude and Frequency of Sinusoidal Signals Using Calculus of Finite Differences".

IEEE Transactions on Power Apparatus and Systems, vol. PAS–103, No. 8, Aug. 1984, pp. 2230–2236, C. T. Nguyen, et al., "A New Technique for Rapid Tracking of Frequency Deviations Based on Level Crossings".

IEEE Transactions on Instrumentation and Measurement, vol. 37, No. 1, Mar. 1988, pp. 147–148, Mukhtar AHMAD, "Power System Frequency Deviation Measurement Using an Electronic Bridge".

International Journal of Electronics, vol. 56, No. 1, Jan. 1984, pp. 127–134, V. K. Govindan, et al., "A Novel Method for Digital Monitoring of Frequency Deviation in Power Systems".

*Primary Examiner*—Kenneth A. Wieder
*Assistant Examiner*—Glenn W. Brown
*Attorney, Agent, or Firm*—Oblon, Spivak, McClelland, Maier & Neustadt

[57] ABSTRACT

A frequency detecting method for detecting a frequency of an AC electric parameter of an electric power system. The frequency detecting method comprises a sampling step of sampling the AC electric parameter of the electric power system at a predetermined sampling period, an adding step of adding a sampling value $v_m$ sampled at a sampling time m and a sampling value $v_{m-n}$ sampled at a sampling time (m-n), thereby obtaining a sum $w_m$ of the sampling values, a first RMS value calculating step of calculating a first electric parameter E1 corresponding to a RMS value of the sum $w_m$, a second RMS value calculating step of calculating a second electric parameter E2 corresponding to a RMS value of a time-differential value $u_m$ of the sum $w_m$, a dividing step of dividing the second electric parameter E2 by the first electric parameter E1, and a frequency detecting step of detecting the frequency of the AC electric parameter from a division result (E2/E1).

22 Claims, 6 Drawing Sheets

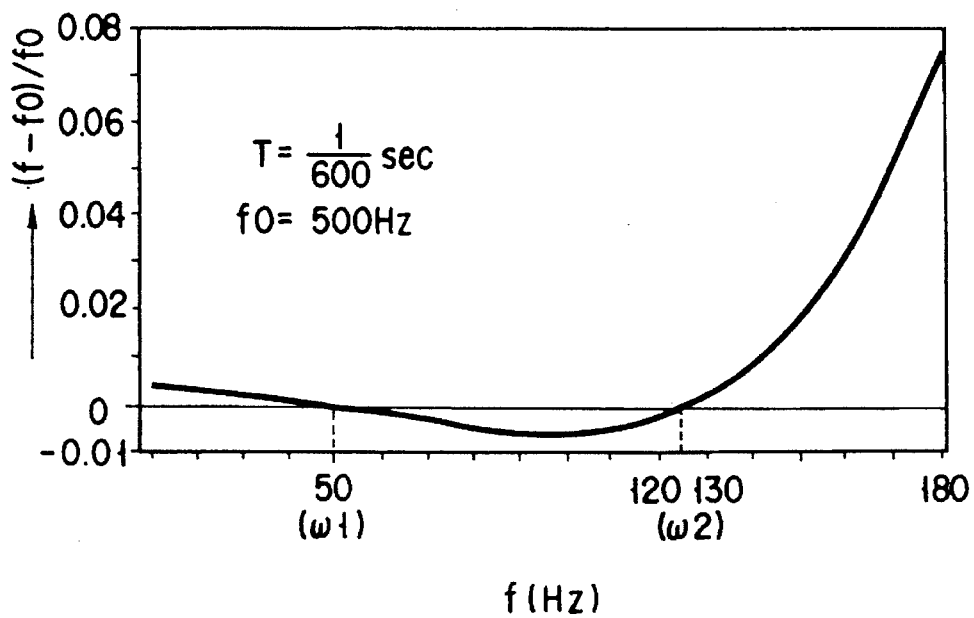
F I G. 3
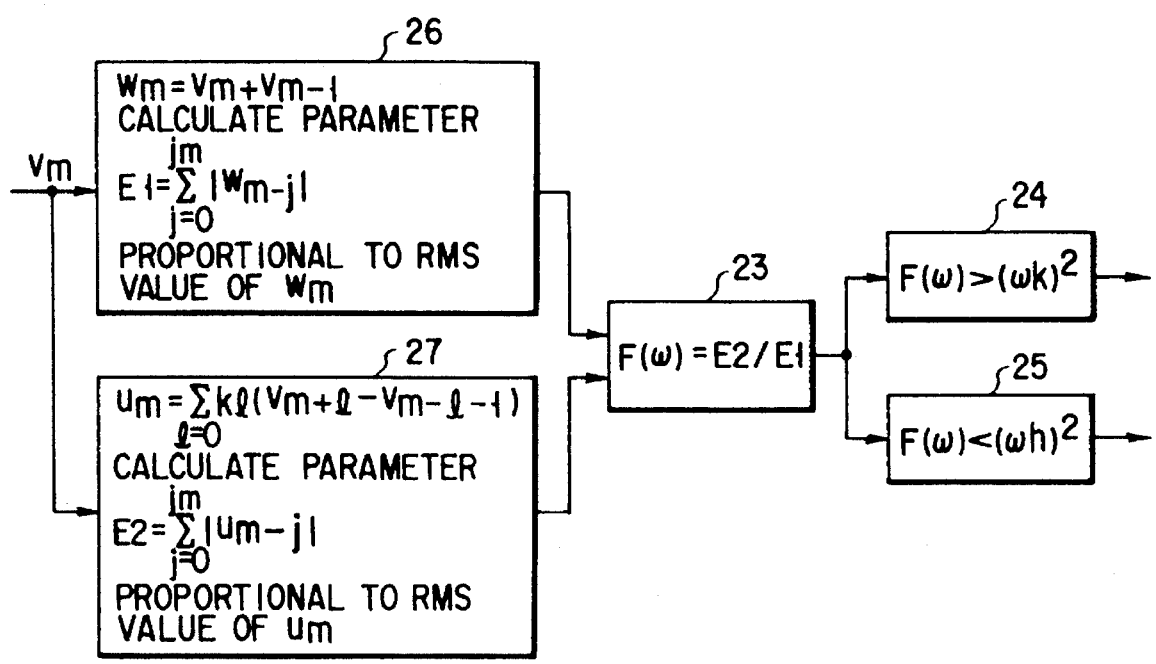
F I G. 4

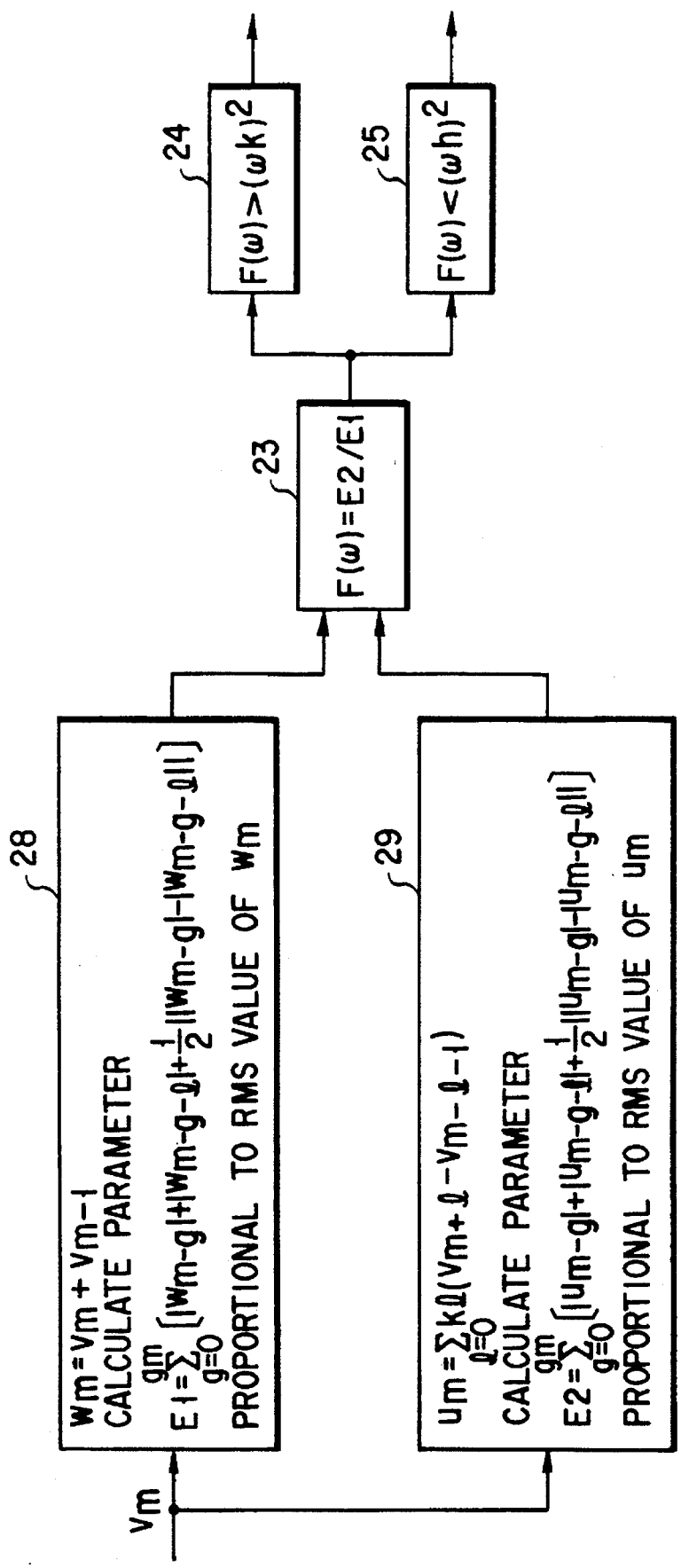
F I G. 5

METHOD AND AN APPARATUS FOR DETECTING A FREQUENCY OF A POWER SYSTEM

BACKGROUND OF THE INVENTION

1. Field of the Invention

The present invention relates to a method and an apparatus for accurately detecting a frequency of an AC electric parameter of an electric power system.

2. Description of the Related Art

In an electric power system including electric power plants for generating power, transfer plants, such as transmission lines and substations, for transferring the power generated by the electric power plants, and demand plants which consume the power transferred and distributed by the transfer plants, when a generator of an electric power plant is stopped, since power supplied to the electric power system is reduced, loads on functioning generators are increased and the rotation rates of the generators are lowered. In contrast, when a load, i.e., a demand plant, is eliminated, since power is oversupplied to the electric power system, the generators of the electric power plants are accelerated and the frequency of the electric power system is increased.

An electric power system is most stabilized when the frequency thereof corresponds to a fundamental frequency. Therefore, in order that the electric power system is operated stably, it is necessary to detect, with high accuracy, how much the frequency of the electric power system is deviated from the fundamental frequency. Further, in controlling excitation of a generator, it is necessary to detect a frequency in a wide range at high speed.

In consideration of the aforementioned technical background, a method for detecting how much the frequency of the electric power system is deviated from the fundamental frequency, using the following algorithm, is proposed.

$$\frac{v_{m-3} \cdot v_{m-12} - v_m \cdot v_{m-15}}{v_{m-3}^2 - v_m \cdot v_{m-6}} \propto \frac{\sin(2\pi\epsilon)}{\cos(\pi\epsilon/2)} \quad (1a)$$

In the above formula, "m" represents a sampling time series and a sampling frequency is 12 times the fundamental frequency of an AC electric parameter of the electric power system. Thus, the time series (m−3) means data which is ¼ cycle late for the time series m. "ε" represents a relative error with respect to the fundamental frequency of 1. The relative error "ε" is obtained by the following equation: ε=Δf/fo= Δω/ωo, where the fundamental frequency of the electric power system is fo (ωo) and a deviation from the fundamental frequency fo (ωo) is Δf(f−f0).

However, as clear from FIG. 8 showing a frequency characteristic, the linearity of the frequency characteristic is decreased and a calculation error respect to a left side of the formula (1a) is increased, in accordance with the increase of the relative error ε (quadrature axis), i.e., the deviation between the frequency f of the electric power system and the fundamental frequency f0. Thus, a relative error ε cannot be calculated accurately. Therefore, in a conventional method, the formula (1a) is preset in a known table to detect the relative error ε. A calculation result of the left side of the formula (1a) is input to the table, thereby obtaining a relative error ε output in accordance with the calculation result.

Therefore, a frequency can be detected accurately only within a narrow range in which the relative error ε is nearly zero and the linearity of the frequency characteristic in FIG. 8 is maintained, i.e., a range of the frequency nearly the fundamental frequency of the AC electric parameter in FIG. 8.

SUMMARY OF THE INVENTION

The present invention has been made in consideration of the above problem, and its object is to provide a method and an apparatus which can detect a frequency of an electric power system, even when the frequency of the electric power system is greatly deviated from a fundamental frequency.

According to an aspect of the present invention, there is provided a method for detecting a frequency of an AC electric parameter of an electric power system, comprising: a sampling step of sampling the AC electric parameter (voltage or current) of the electric power system at predetermined sampling periods; an adding step of adding a sampling value $v_m$ sampled at a sampling time m and a sampling value $v_{m-n}$ sampled at a sampling time (m−n), thereby obtaining a sum $w_m$ of the sampling values; a first effective value calculating step of calculating a first electric parameter E1 corresponding to a RMS (roote-means-squre) value of the sum $w_m$ obtained in the adding step; a second effective value calculating step of calculating a time-differential value of the sum $w_m$, using a correction differential approximation equation and calculating a second electric parameter E2 corresponding to a RMS value of the time differential value $u_m$; and a dividing step of dividing the second electric parameter E2 by the first electric parameter E1 and outputting a division result (E2/E1) as a value corresponding to the frequency of the AC electric parameter.

Since the AC electric parameter of the electric power system is represented by V·sin (ωt), the time-differential value of the AC electric parameter is represented by ω·V cos (ωt). From this formula, it is understood that the amplitude of the time-differential value of an AC electric parameter is proportional to the angular frequency ω. For this reason, the division result obtained by dividing the second electric parameter E2 by the first electric parameter E1 is proportional to the square of the frequency of the AC power system.

Therefore, according to the frequency detecting method of the present invention as described above, since the AC electric parameter of the electric power system is time-differentiated in every frequency region (not only in the proximity of the fundamental frequency as in the conventional art), the frequency can be calculated in a wide continuous range with high accuracy, irrespective of the AC electric parameter.

According to another aspect of the present invention, there is provided a frequency detecting apparatus for detecting a frequency of an electric parameter of an electric power system, comprising: a sampling unit for sampling the AC electric parameter of the electric power system at predetermined sampling periods; an adding section for adding a sampling value $v_m$ sampled at a sampling time m and a sampling value $v_{m-n}$ sampled at a sampling time (m−n), thereby obtaining a sum $w_m$ of the sampling values; a first effective value calculating section for calculating a first electric parameter E1 corresponding to a RMS value of the sum $w_m$ obtained in the adding step; a second effective value calculating section for calculating a time-differential value of the sum $w_m$, using a correction differential approximation equation and calculating a second electric parameter E2 corresponding to a RMS value of the time differential value $u_m$; and a frequency detecting section for dividing the second electric parameter E2 by the first electric parameter E1 and outputting a division result (E2/E1) as a frequency detected value of the AC electric parameter.

With the frequency detecting apparatus of the present invention, the AC electric parameter of the electric power system is sampled by the sampling unit at predetermined sampling periods, and sampling values are input to the adding section. The adding section adds a sampling value $v_m$ sampled at a sampling time m to a sampling value $v_{m-n}$ sampled at a sampling time (m–n), thereby obtaining a sum $w_m$, which is output to the first effective value calculating section. The first effective value calculating section calculates and outputs a first electric parameter E1 proportional to a RMS value of the sum $w_m$ supplied from the adding section. The second effective value calculating section calculates a time-differential value of the sum $w_m$, using a correction differential approximation equation, and outputs a second electric parameter E2 corresponding to a RMS value of the time differential value $u_m$. The frequency detecting section outputs a frequency detected value of the AC electric parameter obtained by dividing the second electric parameter E2 by the first electric parameter E1.

The frequency detecting apparatus of the present invention may comprise an overfrequency detecting circuit and an underfrequency detecting circuit.

In the overfrequency detecting circuit, an upper limit value of the allowable frequency of the electric power system is set as a threshold value. Whenever a frequency detected value is input from the frequency detecting section, the overfrequency detecting circuit compares the frequency detected value with the threshold value. When the frequency detected value is greater than the threshold value, the overfrequency detecting circuit outputs an instruction for operating a protective relay provided in the electric power system.

In the underfrequency detecting circuit, a lower limit value of the allowable frequency of the electric power system is set as a threshold value. Whenever a frequency detected value is input from the frequency detecting section, the underfrequency detecting circuit compares the frequency detected value with the threshold value. When the frequency detected value is smaller than the threshold value, the underfrequency detecting circuit outputs an instruction for operating a protective relay provided in the electric power system.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 3 is a frequency characteristic diagram for explaining the frequency detecting method of the present invention;

FIG. 4 is a functional block diagram illustrating a frequency detecting method according to a second embodiment of the present invention;

FIG. 5 is a functional block diagram illustrating a frequency detecting method according to a third embodiment of the present invention;

DETAILED DESCRIPTION OF THE PREFERRED EMBODIMENTS

Embodiments of the present invention will be described with reference to the accompanying drawings.

Figure 2:
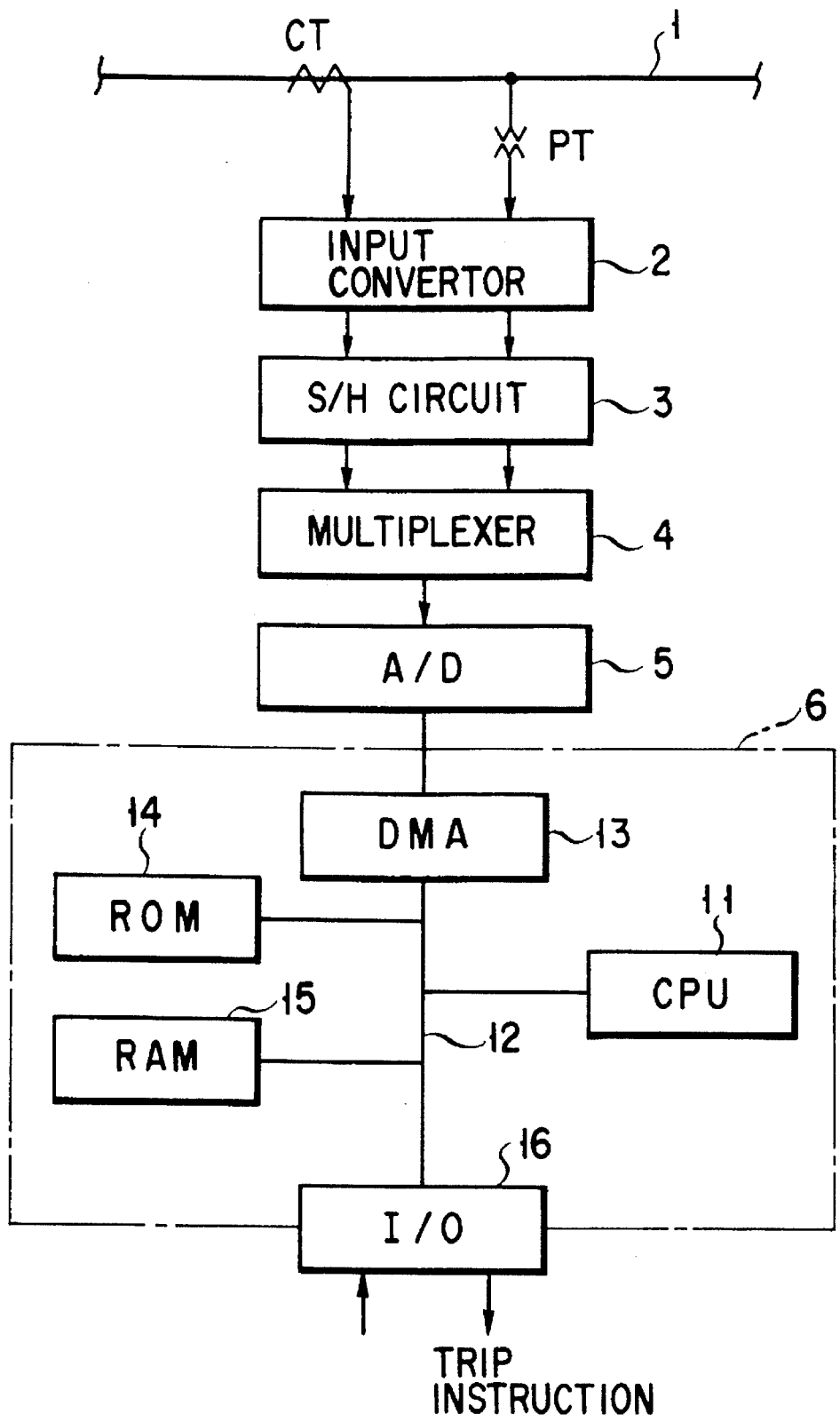
FIG. 2 is a schematic diagram to which the frequency detecting method according to the first embodiment of the present invention is applied.

FIG. 2 is a schematic diagram showing a digital protective relay to which the frequency detecting method of the present invention is applied. In this digital protective relay, a voltage of an electric power system 1 is detected by a potential transformer PT and a current of the electric power system 1 is detected by a current transformer CT. The voltage and the current detected by the potential transformer PT and the current transformer CT are input to a sample and hold circuit (S-H circuit) 3 through an input converter 2. The S-H circuit 3 samples the detected voltage and the detected current supplied from the potential transformer PT and the current transformer CT at a predetermined frequency (sampling frequency) and holds a sampled value until the next sampling time. The detected voltage or the detected current held by the S-H circuit 3 is selected by a multiplexer 4 and input to an A/D converter 5. The A/D converter quantizes the detected voltage or the detected current selected by the multiplexer 4, thereby converting it into a digital amount.

A case where the detected voltage is output from the A/D converter 5 as the AC electric parameter of the power system to detect a frequency will be described below.

An output terminal of the A/D converter, for outputting a digital signal (hereinafter referred to as "detected voltage $v_m$") obtained by quantizing the detected voltage, is connected to an input terminal of a microcomputer 6. In the microcomputer 6, a CPU 11 is connected through an internal bus 12 to a direct memory access (DMA) 13, a ROM 14, a RAM 15 and an I/O 16. The direct memory access 13 operates so that the detected voltage $v_m$ output from the A/D converter 5 is directly written in the RAM 15. The ROM 14 stores a program for detecting a frequency from the detected voltage $v_m$ and stores a program for judging a relay operation. The RAM 15 stores the detected voltage $v_m$, and a result in the course of calculation. An input/output interface 16 receives input information from an external device, outputs trip instructions when trip conditions are satisfied, and outputs various instructions to the external device.

Figure 1:
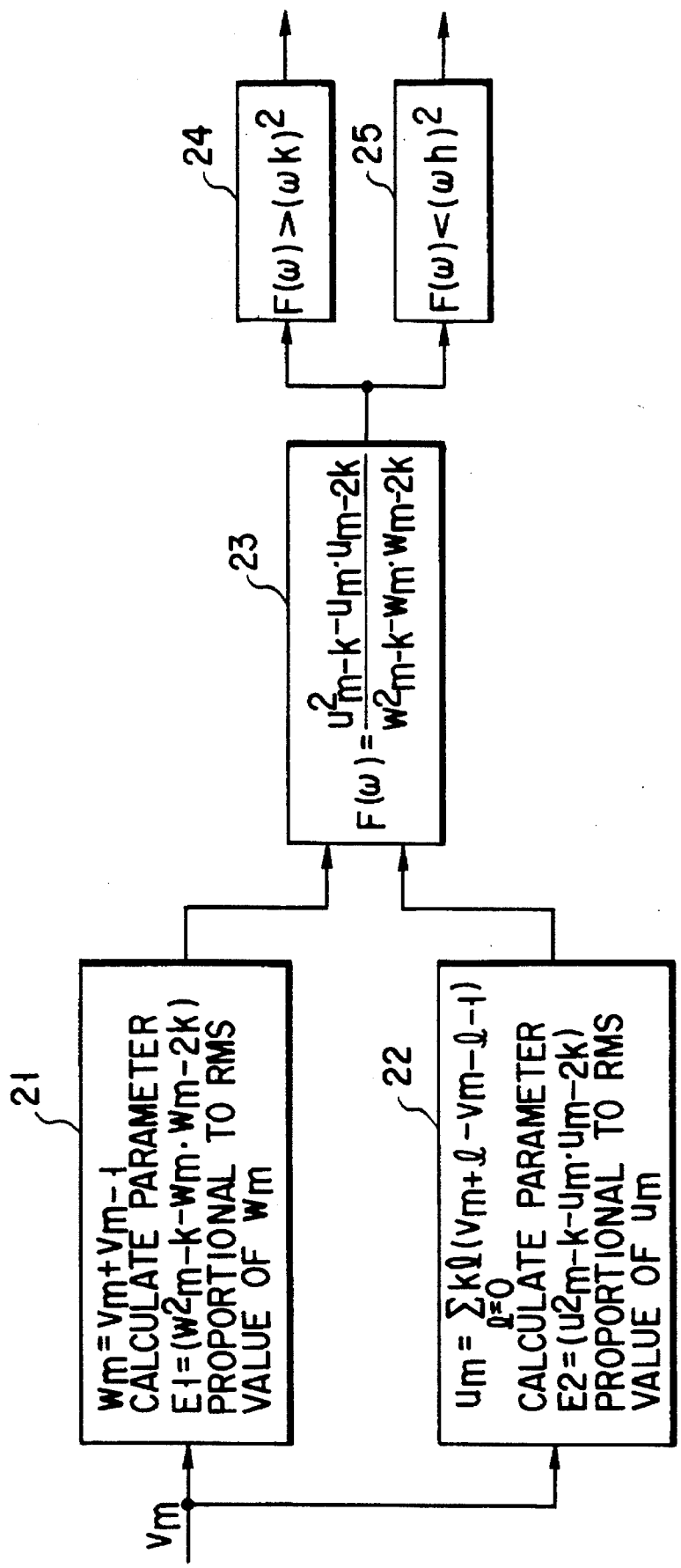
FIG. 1 is a functional block diagram illustrating a frequency detecting method according to a first embodiment of the present invention.

FIG. 1 shows functional blocks for detecting a frequency and judging a relay operation by the CPU. The functional blocks include a first calculating section 21 for adding detected voltages $v_m$ at predetermined sampling times to obtain an electric parameter E1 in proportion to a RMS value of an AC electric parameter $w_m$, a second calculating section 22 for time-differentiating the AC electric parameter $w_m$ to obtain an electric parameter E2 proportional to a RMS value of the differentiated value, a dividing section 23 for dividing the electric parameter E2 by the electric parameter E1, an overfrequency detecting relay 24, and an underfrequency detecting relay 25.

An operation of the above embodiment will now be described.

An AC voltage of the electric power system 1 detected by the potential transformer PT is quantized by the A/D converter 5 and converted to a detected voltage $v_m$. The detected voltage $v_m$ is stored in the RAM 15 by the DMA 13. The CPU 11 reads the detected voltage $v_m$ from the RAM 15 and excutes the first and second calculating sections 21 and 22.

The first calculating section 21 calculates sum $w_m$ (=$v_m$+$v_{m-n}$) of the detected voltage $v_m$ at the sampling time m and a detected voltage $v_{m-n}$ at a sampling time (m-n), which is n sampling before the sampling time M (Step 1). Then, an electric parameter E1 proportional to the RMS value of the sum $w_m$ is calculated on the basis of the following equation (Step 2):

$$E1 = w_{m-k}^2 - w_m \cdot w_{m-2k}$$

The second calculating section 22 time-differentiates an AC electric parameter (consisting of a plurality of detected voltages at different sampling time) to obtain a time-differential value um on the basis of the following equation (Step 3):

Time-differential value $u_m = \Sigma kl^*(v_{m+l} - v_{m-l-n})$ where kl is an approximation coefficient and l is a differential correction degree (l=0, 1, 2 ...). The values 0 or 1 is normally used as the degree l, in consideration of the calculation time and the error detecting accuracy.

Then, an electric parameter E2 proportional to the RMS value of the obtained time-differential value $u_m$ is calculated on the basis of the following equation (Step 4):

$$E2 = u_{m-k}^2 - u_m \cdot u_{m-2k}$$

Subsequently, the electric parameters E1 and E2 are respectively supplied from the first calculating section 21 and the second calculating section 22 to the dividing section 23. In the dividing section 23, an electric parameter $F(\omega)$ representing a relation with the frequency of the electric power system 1 is calculated on the basis of the following equation (Step 5):

$$F(\omega) = (u_{m-k}^2 - u_m \cdot u_{m-2k})/(w_{m-k}^2 - w_m \cdot w_{m-2k})$$

The electric parameter $F(\omega)$ calculated by the dividing section 23 is detected as $F(\omega) = (\omega/\omega o)^2$, where "$\omega o$" is a fundamental frequency (known) and "$\omega$" is an actual frequency. In this manner, the AC electric parameter of the electric power system 1, i.e., the frequency of the AC voltage (actually, the value proportional to the frequency), is detected.

In this embodiment, the present invention is applied to a protective relay apparatus. Hence, after the frequency of the AC voltage of the electric power system 1 is detected, the overfrequency detecting relay 24 and the underfrequency detecting relay 25 on the subsequent stages judge relay operations.

More specifically, the value $F(\omega)$, calculated by the dividing section 23 and proportional to the actual frequency, is input to the overfrequency detecting relay 24 and the underfrequency detecting relay 25. An upper limit $(\omega k)^2$ of $F(\omega)$ is preset in the overfrequency detecting relay 24. $\omega k$ is a upper limit for allowable frequency. When a detected value supplied from the dividing section 23 satisfies the following condition, the overfrequency detecting relay 24 output a trip instruction signal:

$$F(\omega) = (\omega)^2 > (\omega k)^2$$

A lower limit $(\omega h)^2$ of $F(\omega)$ is preset in the underfrequency detecting relay 25. $\omega h$ is a lower limit for allowable frequency. When a detected value supplied from the dividing section 23 satisfies the following condition, the underfrequency detecting relay 25 output a trip instruction signal:

$$F(\omega) = (\omega)^2 < (\omega h)^2$$

A trip instruction signal output from the relay 24 or 25 is supplied from the computer 6 through the I/O interface 16 to a corresponding external device (e.g., a breaker).

Calculation results of the aforementioned frequency detection will be considered.

Assuming that n=1, the differential correction degree l=0,1, and the sampling value $v_m$ at the sampling time $t_m$ is set as $v_m = v \cdot \sin(\omega t_m)$, the sum $w_m$ and the time-differential value $u_m$ are obtained as follows:

$$w_m = v_m + v_{m-1} = 2V \cdot \cos(\omega T/2) \cdot \sin(\omega t_m - \omega T/2) \quad (1)$$

$$\begin{aligned} u_m &= \Sigma kl \cdot (v_{m+l} - v_{m-l-n}) \quad (2) \\ &= k1 \cdot (v_m - v_{m-1}) + k2 \cdot (v_{m+1} - v_{m-2}) \\ &= 2V \cdot \{k1 \cdot \sin(\omega T/2) + k2 \cdot \sin(3\omega T/2)\} \cdot \\ &\quad \cos(\omega t_m - \omega T/2) \end{aligned}$$

The time-differential value of the sum $w_m$ is obtained as follows:

$$\begin{aligned} w_m' &= d(v_m + v_{m-1})/dt \quad (3) \\ &= 2V \cdot \omega \cdot \cos(\omega T/2) \cdot \cos(\omega t_m - \omega T/2) \end{aligned}$$

(where "T" is a sampling period.)

If the constant k1 and k2 are determined so that the part $k1 \cdot \sin(\omega T/2) + k2 \cdot \sin(3\omega T/s)$ (hereinafter referred to as a calculation part X) of the equation (2) is equal to the part $\omega \cdot \cos(\omega T/2)$ (hereinafter referred to as a calculation part Y) of the equation (3), since the time-differential value $u_m$ is equal to the time-differential value $w_m'$, the time-differential value of the sun $w_m$ is obtained from equation (2) or equation (3). Details are disclosed in U.S. Pat. No. 4,577,254. In the present case, the equation (3) is used as a differential equation. Further, since $2 \cdot \cos(\omega T/2)$ concerning the amplitude in the equation (2) and $(\omega t_m - \omega T/2)$ are constant, even if they are omitted, the means of the equations are not changed. Therefore, $2 \cdot \cos(\omega T/W)$ is replaced by 1 and $(\omega t_m - \omega T/2)$ is replaced by $\omega t_m$ in the following explanation.

The parameters E1 and E2 proportional to the RMS values of the AC electric parameters w and u are obtained by the following equations:

$$\begin{aligned} E1 &= w_{m-k}^2 - w_m \cdot w_{m-2k} \quad (4) \\ &= V^2 \sin^2(\omega t_m - \omega T \cdot (k+1/2)) \cdot \\ &\quad V^2 \sin(\omega t_m - \omega T/2) \cdot \sin(\omega t_m - \omega T \cdot (2k+1/2)) \\ &= V^2\{(1 - \cos(2\omega t_m - 2\omega T \cdot (k+1/2))/2 - \\ &\quad (\cos(2k \cdot \omega T) - \cos(2 \cdot \omega t_m - 2\omega T \cdot (k+1/2)))/2\} \\ &= V^2\{(1 - \cos(2k \cdot \omega T))\}/2 \end{aligned}$$

$$\begin{aligned} E2 &= u_{m-k}^2 - u_m \cdot u_{m-2k} \quad (5) \\ &= V^2 \cos^2(\omega t_m - \omega T \cdot (k+1/2)) - \\ &\quad V^2 \cos(\omega t_m - \omega T/2) \cdot \cos(\omega t_m - \omega T \cdot (2k+1/2)) \\ &= (\omega V)^2\{(1 + \cos(2\omega t_m - 2\omega T \cdot (k+1/2))/2 - \\ &\quad (\cos(2k \cdot \omega T) + \cos(2 \cdot \omega t_m - 2\omega T \cdot (k+1/2)))/2\} \\ &= (\omega V)^2(1 - \cos(2k \cdot \omega T))/2 \end{aligned}$$

To satisfy the condition X=Y, the following equation should be satisfied.

$$\omega \times \cos(\omega T/2) = (k1 \times \sin(\omega T/2) + k2 \times \sin(3\omega T/2)) \quad (6)$$

As clear from a frequency characteristic curve shown in FIG. 3, the error is zero, when the frequency $\omega$ is $\omega 1$ or $\omega 2$.

Therefore, the constants k1 and k2, which satisfy the equation (6) when the frequency is ω1 or ω2, are obtained by the following equations:

$$k1 = \{\omega 1 \cdot \cos(\omega 1 T/2) \cdot \sin(3\omega 2 T/2) - \omega 2 \cdot \cos(\omega 2 T/2) \cdot \sin(3\omega 1 T/2)\} / \{\sin(\omega 1 T/2) \cdot \sin(3\omega 2 T/2) - \sin(\omega 2 T/2) \cdot \sin(3\omega 1 T/2)\} \quad (8)$$

$$k2 = \{\omega 2 \cdot \cos(\omega 2 T/s) \cdot \sin(\omega 1 T/2) - \omega 1 \cdot \cos(\omega 1 T/2) \cdot \sin(\omega 2 T/2)\} / \{\sin(\omega 1 T/2) \cdot \sin(3\omega 2 T/2) - \sin(\omega 2 T/2) \cdot \sin(3\omega 1 T/2)\}$$

The value F(ω) obtained by dividing the equation (5) by the equation (4) is proportional to the square of the frequency, as represented by the following equation.

$$F(\omega) = (u_{m-k}^2 - u_m \cdot u_{m-2k})/(w_{m-k}^2 - w_m \cdot w_{m-2k}) \quad (9)$$
$$= (\omega)^2$$

The detection accuracy of the frequency depends on the approximation accuracy of the time-differential value represented by the equation (6). U.S. Pat. No. 4,577,254 provides detailed description of this matter, which is omitted in this specification, since it is not a subject matter of the present invention.

As described above, according to the present invention, the frequency of the system can be calculated in a wider range with higher accuracy, as compared to the calculation represented by the equation (1a) of the conventional art, for the following reason. The conventional method utilizes the linearity of the AC electric parameter only in the region of the fundamental frequency not in the overall frequency region, whereas the present invention utilizes the time-differential values of the overall frequency region of the AC electric parameter. Thus, the frequency can be calculated in a wide continuous range with high accuracy, irrespective of the AC electric parameter.

As described above, according to the present invention, when the frequency ω is ω1 or ω2, the error is zero, and when the frequency is of any other value, the error is as shown in FIG. 3 (where ω1 is equal to a fundamental frequency and ω2 is 2.5 times the fundamental frequency). In this case, the error is represented by the following equation:

$$\epsilon(\omega) = (X \text{ of the equation (2)})/(Y \text{ (true value) of the equation (3)}) - 1 \quad (10)$$
$$= \{k1 \cdot \sin(\omega T/2) + k2 \cdot \sin(3\omega T/2)\}/\omega \cdot \cos(\omega T/2) - 1$$

According to this embodiment, the error can be decreased in a wide range (e.g., 0.2 to 2.5 times the fundamental frequency), not only in the region near the fundamental frequency.

A second embodiment of the present invention will now be described.

In the second embodiment, the function blocks shown in FIG. 4 are applied to the digital protective relay shown in FIG. 2. More specifically, the ROM 14 has the function blocks shown in FIG. 4. A portion having the same function as in the first embodiment shown in FIG. 1 is identified with the same reference numeral as used in FIG. 1.

This embodiment comprises a first calculating section 26 for adding detected voltages $v_m$ at predetermined sampling times to obtain an electric parameter E1 proportional to a RMS value of an AC electric parameter $w_m$ and a second calculating section 27 for time-differentiating the AC electric parameter $w_m$ to obtain an electric parameter E2 proportional to a RMS value of the differentiated value. The other structures of this embodiment are the same as those in the first embodiment.

The first and second calculation sections 26 and 27 employ a calculation method based on the area rule for calculating values proportional to the actual values of the AC electric parameter $w_m$ and $u_m$. Details of the calculation method based on the area method are disclosed in "Electric Calculation", Denki Shoin, November, 1983, Vol. 51, page 49, equation (3).

The first calculating section 26 calculates the electric parameter E1 by a calculation based on the following equation:

$$E1 = \sum_{j=0}^{jm} |w_{m-j}| \propto V \quad (11)$$

where the maximum numeral jm of the number of the sample j is a multiple of the number of samples in a half cycle of the fundamental frequency.

The second calculating section 27 performs a time-differentiation based on a correction differential approximation by using the detected voltage $v_m$, and calculates the electric parameter E2 proportional to a RMS value of the differential value $u_m$ based on the following equation:

$$E2 = \sum_{j=0}^{jm} (u_{m-j}) \propto \omega \cdot V \quad (12)$$

where the maximum numeral jm of the number of the sample j is a multiple of the number of samples in a half cycle of the fundamental frequency.

The electric parameter E2 is divided by the electric parameter E1 in the dividing section 23. The division result is depend on the frequency ω, as clear from the equations (11) and (12). Thus, a value proportional to the frequency of the electric power system is obtained. The processes in the stages subsequent to the dividing section 23 are the same as those in the first embodiment.

A third embodiment of the present invention will be described below.

In the third embodiment, the function blocks shown in FIG. 5 are applied to the digital protective relay shown in FIG. 2. More specifically, the ROM 14 has the function blocks shown in FIG. 5. A portion having the same function as in the first embodiment shown in FIG. 1 is identified with the same reference numeral as used in FIG. 1.

This embodiment comprises a first calculating section 28 for adding detected voltages $v_m$ at predetermined sampling times to obtain an electric parameter E1 proportional to a RMS value of an AC electric parameter $w_m$ and a second calculating section 29 for time-differentiating the AC electric parameter $w_m$ to obtain an electric parameter E2 proportional to a RMS value of the differentiated value. The other structures of this embodiment are the same as those in the first embodiment.

The first and second calculation sections 28 and 29 use a calculation method based on the binary addition method for calculating values proportional to the RMS values of the AC electric parameter $w_m$ and $u_m$. The details of the calculation method based on the binary addition method are disclosed in "Electric Calculation", Denki Shoin, November, 1983, Vol. 51, page 49, equation (4).

The first calculating section 28 calculates the electric parameter E1 by a calculation based on the following equation:

$$E1 = \sum_{g=0}^{gm} \{|w_{m-g}| + |w_{m-g-l}| + \tag{13}$$

$$(\tfrac{1}{2})||w_{m-g}| - |w_{m-g-l}||\} \propto V$$

where the maximum number gm of g is the number of samples in a half cycle period of the fundamental frequency and the l is the number of samples in a quarter cycle period of the fundamental frequency /2.

The second calculating section 29 performs a time-differentiation based on a correction differential approximation using the following equation for the detected voltage $v_m$ to calculates the electric parameter E2 proportional to a RMS value of the differential value $u_m$:

$$E2 = \sum_{g=0}^{gm} |u_{m-g}| + |u_{m-g-l}| + \tag{14}$$

$$(\tfrac{1}{2})||u_{m-g}| - |u_{m-g-l}|| \propto V$$

where the maximum number gm of g is (l-1) and the maximum number of l is an integer j/2.

The electric parameter E2 is divided by the electric parameter E1 in the dividing section 23. The division result is proportional to the frequency ω, as clear from the equations (13) and (14). Thus, a value proportional to the frequency of the electric power system is obtained. The processes in the stages subsequent to the dividing section 23 are the same as those in the first embodiment.

A fourth embodiment of the present invention will be described.

Figure 6:
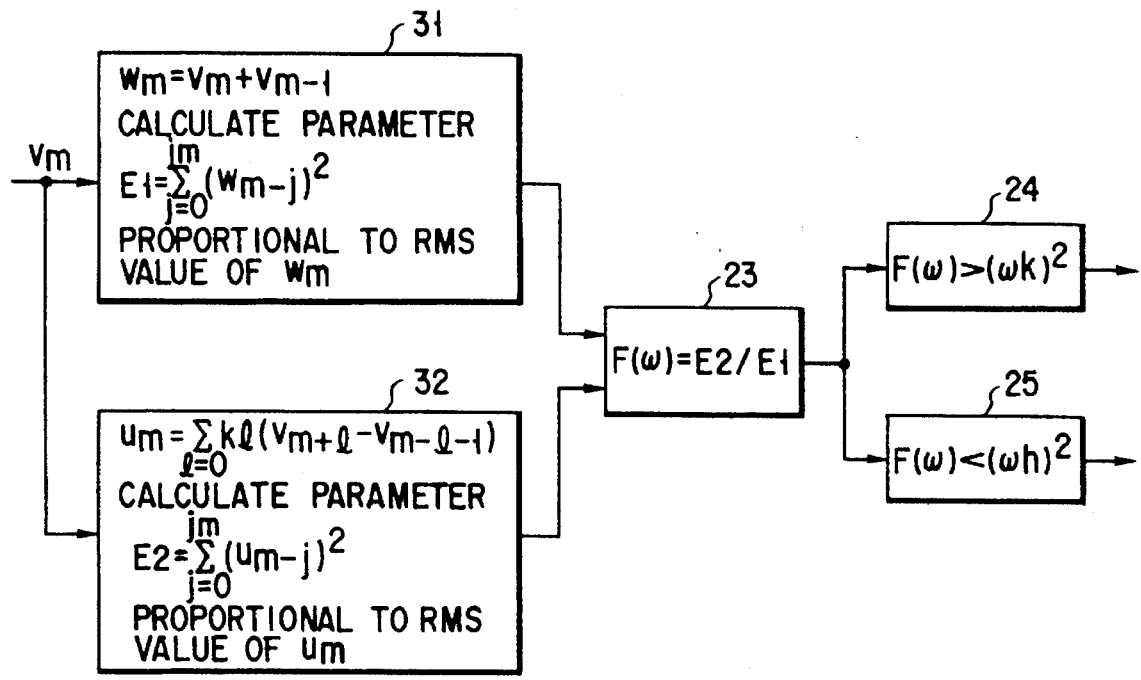
FIG. 6 is a functional block diagram illustrating a frequency detecting method according to a fourth embodiment of the present invention.
Figure 8:
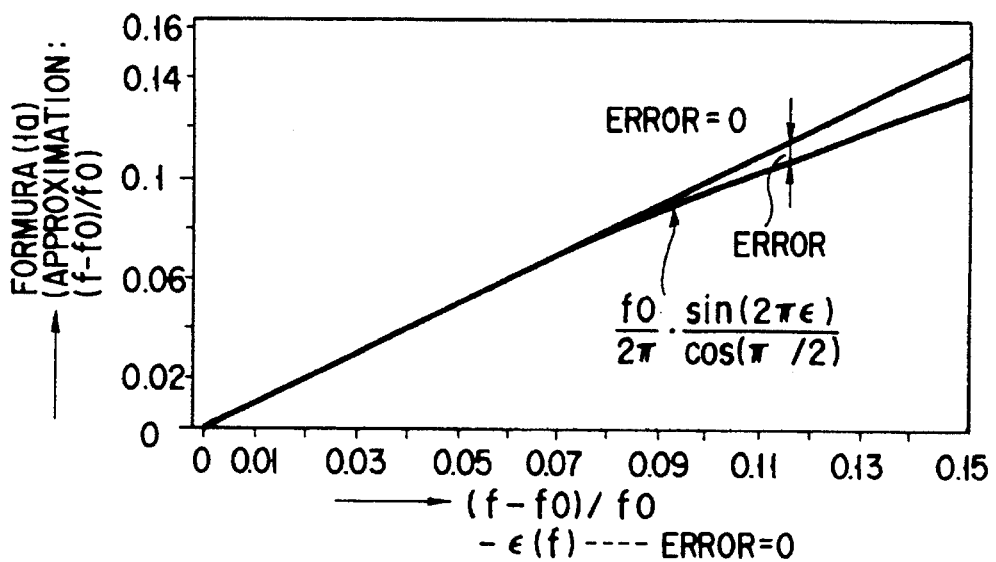
FIG. 8 is a frequency characteristic diagram for explaining a conventional frequency detecting method.

In the fourth embodiment, the function blocks shown in FIG. 6 are applied to the digital relay shown in FIG. 2. More specifically, the ROM 14 has the function blocks shown in FIG. 6. A portion having the same function as in the first embodiment shown in FIG. 1 is identified with the same reference numeral as used in FIG. 1.

This embodiment comprises a first calculating section 31 for adding detected voltages $v_m$ at predetermined sampling times to obtain an electric parameter E1 in proportion to a RMS value of an AC electric parameter $w_m$ and a second calculating section 32 for time-differentiating the AC electric parameter $w_m$ to obtain an electric parameter E2 proportional to a RMS actual value of the differentiated value. The other structures of this embodiment are the same as those in the first embodiment.

The first and second calculation sections 31 and 32 employ the following equations (15) and (16) for calculating values proportional to the RMS values of the AC electric parameter $w_m$ and $u_m$.

The first calculating section 31 calculates the electric parameter E1 by a calculation based on the following equation:

$$E1 = \sum_{j=0}^{jm} (w_{m-j})^2 = 3V^2 \tag{15}$$

where V represents an amplitude of an AC voltage and the maximum member jm of j is a multiple of the number of samples in a half cycle of the AC voltage.

The second calculating section 32 performs a time-differentiation based on a correction differential approximation using the following equation for the detected voltage $v_m$ to calculates the electric parameter E2 proportional to a RMS value of the differential value $u_m$:

$$E2 = \sum_{j=0}^{jm} (u_{m-j})^2 = 3(\omega V)^2 \tag{16}$$

where the maximum number jm of j is a multiple of the number of samples in a half cycle of the AC voltage.

The electric parameter E2 is divided by the electric parameter E1 in the dividing section 23. The division result is proportional to the frequency ω, as clear from the equations (15) and (16). Thus, a value proportional to the frequency of the electric power system is obtained. The processes in the stages subsequent to the dividing section 23 are the same as those in the first embodiment.

A fifth embodiment of the present invention will now be described.

Figure 7:
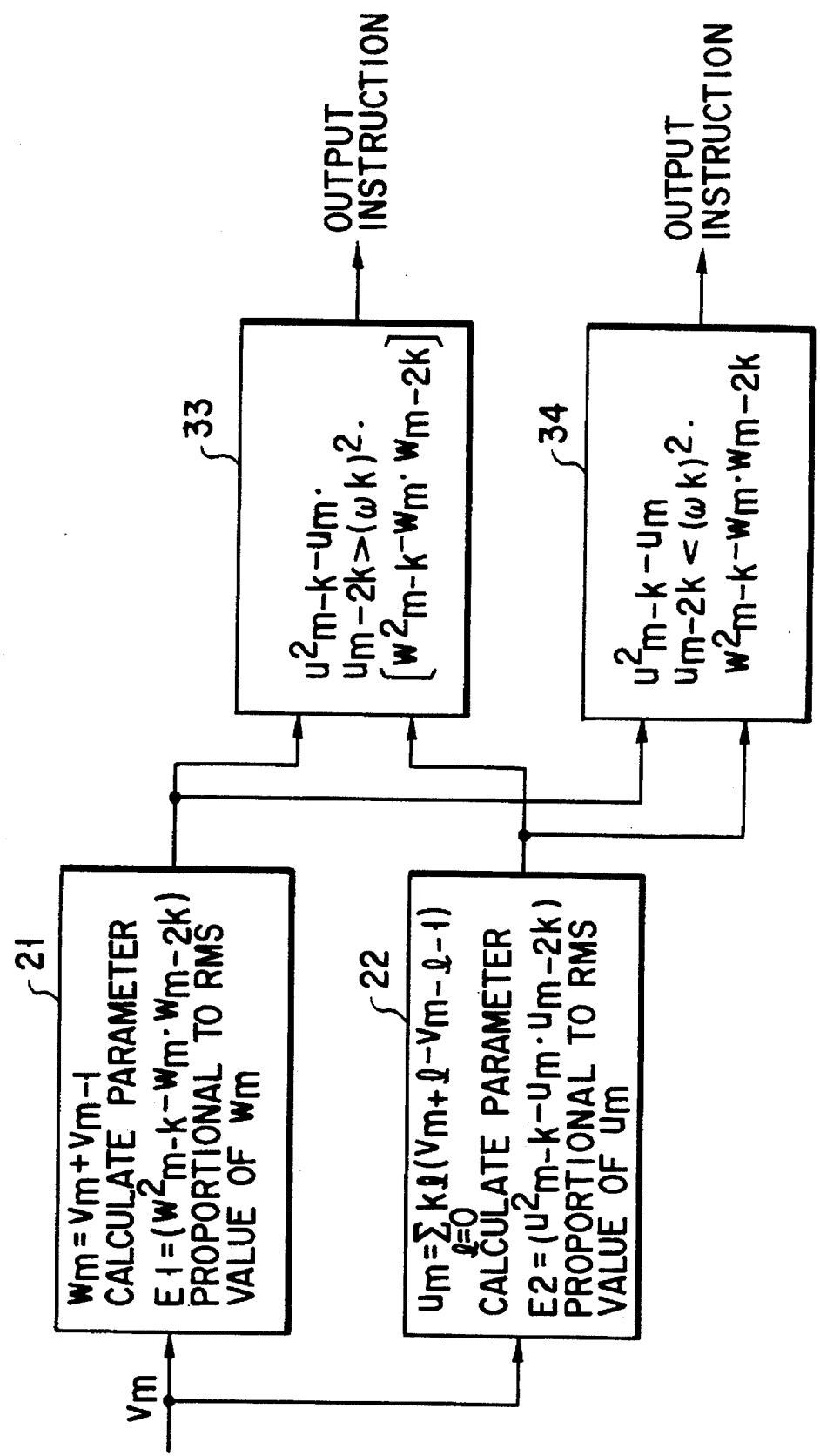
FIG. 7 is a functional block diagram illustrating a frequency detecting method according to a fifth embodiment of the present invention.

In the fifth embodiment, the function blocks shown in FIG. 7 are applied to the digital protective relay shown in FIG. 2. More specifically, the ROM 14 has the function blocks shown in FIG. 7. A portion having the same function as in the first embodiment shown in FIG. 1 is identified with the same reference numeral as used in FIG. 1.

This embodiment comprises a first calculating section 21 for adding detected voltages $v_m$ at predetermined sampling times to obtain an electric parameter E1 proportional to a RMS value of an AC electric parameter $w_m$, a second calculating section 22 for time-differentiating the AC electric parameter $w_m$ to obtain an electric parameter E2 proportional to a RMS value of the differentiated value, an overfrequency determining section 33 for receiving outputs from the first and second calculating sections 21 and 22 and determining overfrequency, and an underfrequency determining section 34 for receiving outputs from the first and second calculating sections 21 and 22 and determining underfrequency.

The first and second calculating sections 21 and 22 operate in the same manner as in the first embodiment and respectively output the values E1 and E2 to the overfrequency determining section 33 and the underfrequency determining section 34.

The outputs E1 and E2 of the first and second calculating sections are:

$$E1 = w_{m-k}^2 - w_m \cdot w_{m-2k}$$
$$= V^2\{1 - \cos(2k \cdot \omega T)\}/2$$

$$E2 = u_{m-k}^2 - u_m \cdot u_{m-2k}$$
$$= (\omega V)^2\{1 - \cos(2k \cdot \omega T)\}/2$$

The overfrequency determining section 33 determines whether a detected frequency is greater than a preset frequency ωk based on the above output E1 and E2, using the following equation.

$$u_{m-k}^2 - u_m \cdot u_{m-2k} = (\omega V)^2\{1 - \cos(2k \cdot \omega T)\}/2$$
$$> (\omega k)^2 \cdot (w_{m-k}^2 - w_m \cdot w_{m-2k}) = V^2\{1 - \cos(2k \cdot \omega T)\}/2$$

When the above condition is satisfied, the overfrequency determining section 33 outputs a trip instruction signal.

The underfrequency determining section 34 determines whether a detected frequency is greater than a preset frequency ωk based on the above output E1 and E2, using the following equation.

$$u_{m-k}^2 - u_m \cdot u_{m-2k} = (\omega V)^2\{1 - \cos(2k \cdot \omega T)\}/2$$
$$< (\omega k)^2 \cdot (w_{m-k}^2 - w_m \cdot w_{m-2k}) = V^2\{1 - \cos(2k \cdot \omega T)\}/2$$

When the above condition is satisfied, the underfrequency determining section 34 outputs a trip instruction signal.

As has been described above, according to the present invention, the frequency of the electric power system is detected using an electric parameter V·sin (ωt) of the system and an electric parameter ωV cos (ωt) obtained by time-differentiating the former parameter, on the basis of the fact that the amplitude of the latter parameter is proportional to the frequency ω. For this purpose, the present invention uses an algorithm for accurately calculating a time-differential value from a sampling value of an AC electric parameter. Thus, a frequency can be detected with a desired accuracy in a wide frequency band.

What is claimed is:

1. A method for detecting a frequency of an AC electric voltage of an electric power system, comprising the steps of:
   a) sampling the AC electric voltage from said electric power system at a predetermined period T to obtain a sampled analog signal and converting the sampled analog signal to a digital signal v;
   b) storing in a first memory means the digital signal v at each sampling time;
   c) causing a processing unit to execute the following steps d)–j) in accordance with a program stored in a second memory means;
   d) reading from the first memory means a digital signal $v_m$ representing the digital signal v at a sampling time $t_m$ and a digital signal $v_{m-n}$ representing the digital signal v at a sampling time $t_{m-n}$, where $t_m = t_{m-n} + nT$;
   e) summing digital signals $v_m$ and $v_{m-n}$ to obtain a digital signal $w_m$;
   f) reading from the first memory means a digital signal $v_{m+l}$ representing the digital signal v at a sampling time $t_{m+l}$ and a digital signal $v_{m-l-n}$ representing the digital signal v at a sampling time $t_{m-l-n}$ where $t_{m+l} = t_{m-l-n} + (2l+n)T$;
   g) determining a difference between digital signals $v_{m+l}$ and $v_{m-l-n}$ to obtain a digital signal $u_m$;
   h) converting the digital signal $w_m$ to a digital signal E1 representing a first effective value thereof;
   i) converting the digital signal $u_m$ to a digital signal E2 representing a second effective value thereof; and
   j) detecting the frequency of the AC electric voltage by dividing said digital signals E1 and E2, and outputting from an input/output interface circuit a digital signal F(ω) representing the detected frequency.

2. The method according to claim 1, wherein
said step g) obtains the digital signal $u_m$ by performing $$u_m = \Sigma kl\, (v_{m+l} v_{m-l-n});$$

said step h) obtains the digital signal E1 performing $$E1 = w_{m-k}^2 - w_m \cdot w_{m-2k};\text{ and}$$

said step i) obtains the digital signal E2 by performing $$E2 = u_{m-k}^2 - u_m \cdot u_{m-2k}$$

where k is an integer representing a sampling time, kl is an approximation coefficient and l is a differential correction value.

3. The method according to claim 1, wherein
said step g) obtains the digital signal $u_m$ by performing $$u_m = \Sigma kl\, (v_{m+l} - v_{m-l-n});$$

said step h) obtains said digital signal E1 by performing $$E1 = \sum_{j=0}^{j_m} |w_{m-j}|;\text{ and}$$

said step i) obtains said digital signal E2 by performing $$E2 = \sum_{j=0}^{j_m} |u_{m-j}|,$$

where $j_m$ is a multiple of sampling times in a half cycle period of a fundamental frequency of the electric power system, kl is an approximation coefficient and l is a differential correction value.

4. The method according to claim 1, wherein
said step g) obtains the digital signal $u_m$ by performing $$u_m = \Sigma kl\, (v_{m+l} - v_{m-l-n});$$

said step h) obtains said digital signal E1 by performing $$E1 = \sum_{g=0}^{g_m} \{|w_{m-g}| + |w_{m-g-l}| + (1/2)||w_{m-g}| - |w_{m-g-l}||\};$$

and said step i) obtains said digital signal E2 by performing $$E2 = \sum_{g=0}^{g_m} \{|u_{m-j}| + |u_{m-g-l}| + (1/2)||u_{m-n}| - |u_{m-g-l}||\},$$

where $g_m$ is an integer of (l–1), l is a differential correction value, a maximum number of which is an integer j/2, j is a multiple of sampling times in a half cycle period of a fundamental frequency of the electric power system and kl is an approximation coefficient.

5. The method according to claim 1, wherein
said step g) obtains the digital signal $u_m$ by performing $$u_m = \Sigma kl\, (v_{m+l} - v_{m-l-n});$$

said step h) obtains said digital signal E1 by performing $$E1 = \sum_{j=0}^{j_m} (w_{m-j})^2;\text{ and}$$

said step i) obtains said digital signal E2 by performing $$E2 = \sum_{j=0}^{j_m} (u_{m-j})^2,$$

where $j_m$ is a multiple of sampling times in a half cycle period of a fundamental frequency of the electric power system, kl is an approximation coefficient and l is a differential correction value.

6. The method according to claim 1, wherein
said step j) supplies said digital signal F(ω) to a circuit, wherein
the circuit receiving said digital signal F(ω) compares said digital signal F(ω) with a predetermined upper limit threshold and outputs a signal representing that the frequency is too high if said digital signal F(ω) exceeds said upper limit threshold.

7. The method according to claim 1, wherein
said step j) supplies said digital signal F(ω) to a circuit, wherein
the circuit receiving said digital signal F(ω) compares said digital signal F(ω) with a predetermined lower limit threshold and outputs a signal representing that the frequency is too low if said digital signal F(ω) is less than said lower limit threshold.

8. A method for detecting a frequency of an AC electric voltage of an electric power system, comprising the steps of:

a) sampling the AC electric voltage from said electric power system at a predetermined period T to obtain a sampled analog signal and converting the sampled analog signal to a digital signal v;

b) storing in a first memory means the digital signal v at each sampling time;

c) causing a processing unit to execute the following steps d)–j) in accordance with a program stored in a second memory means;

d) reading from the first memory means a digital signal $v_m$ representing the digital signal v at a sampling time $t_m$ and a digital signal $v_{m-n}$ representing the digital signal v at a sampling time $t_{m-n}$ where $t_m = t_{m-n} + nT$;

e) summing digital signals $v_m$ and $v_{m-n}$ to obtain a digital signal $w_m$;

f) reading from the first memory means a digital signal $v_{m+l}$ representing the digital signal v at a sampling time $t_{m+l}$ and a digital signal $v_{m-l-n}$ representing the digital signal v at a sampling time $t_{m-l-n}$ where $t_{m+l} = t_{m-l-n} + (2l+n)T$;

g) determining a difference between digital signals $v_{m+l}$ and $v_{m-l-n}$ to obtain a digital signal $u_m$;

h) converting the digital signal $w_m$ to a digital signal E1 representing a first effective value thereof;

i) converting the digital signal $u_m$ to a digital signal E2 representing a second effective value thereof; and j) multiplying said digital signal E1 by a constant to obtain a value, comparing said value with said digital signal E2, and detecting that the frequency of said AC electric voltage exceeds a predetermined range.

9. The method according to claim 8, wherein
said step j) outputs a signal indicating that the frequency of the AC electric voltage of said electric power system is too large if said digital signal E2 is greater than the value obtained by multiplying said digital signal E1 by said constant.

10. The method according to claim 8, wherein said step j) outputs a signal indicating that the frequency of the AC electric voltage of said electric power system is too small if said digital signal E2 is smaller than the value obtained by multiplying said digital signal E1 by said constant.

11. An apparatus for detecting a frequency of an AC electric voltage of an electric power system, comprising:

sampling means for sampling the AC electric voltage from said electric power system at a predetermined period T to obtain a sampled analog signal;

an A/D converter for converting the sampled analog signal to a digital signal v;

a first memory means for storing the digital signal v;

a processing unit for executing the following steps 1)–7) in accordance with a program stored in a second memory means to detect the frequency of the AC electric voltage on the basis of the digital signal v:

1) reading from the first memory means a digital signal $v_m$ representing the digital signal v at a sampling time $t_m$ and a digital signal $v_{m-n}$ representing the digital signal v at a sampling time $t_{m-n}$ where $t_m = t_{m-1+nT}$;

2) summing said digital signals $v_m$ and $v_{m-n}$ to obtain a digital signal $w_m$;

3) reading from the first memory means a digital signal $v_{m+l}$ representing the digital signal v sampled at a sampling time $t_{m+l}$ and a digital signal $v_{m-l-n}$ representing the digital signal v at a sampling time $t_{m-l-n}$ where $t_{m+l} = t_{m-l-n} + (2l+n)T$;

4) determining a difference between the digital signals $v_{m+l}$ and $v_{m-l-n}$ to obtain a digital signal $u_m$;

5) converting said digital signal $w_m$ to a digital signal E1 representing a first effective value thereof;

6) converting said digital signal $u_m$ to a digital signal E2 representing a second effective value thereof; and 7) detecting the frequency of the AC electric voltage on the basis of a division result (E2/E1) of said digital signals E1 and E2; and an input/output interface circuit for outputting a digital signal F(ω) representing the detected frequency detected by the processing unit.

12. The apparatus according to claim 11, wherein the step 4) calculates the digital signal $u_m$ using the following equation:

$$u_m 32\ \Sigma kl\ (v_{m+l} - v_{m-l-n})$$

where kl is an approximation coefficient and l is a differential correction value.

13. The apparatus according to claim 12, further comprising:

an overfrequency detecting circuit, wherein said digital signal F(ω) is fed to said overfrequency detecting circuit, wherein said overfrequency detecting circuit stores an upper limit threshold and outputs an operation command to lower the frequency of said AC electric voltage of said electric power system when the digital signal F(ω) exceeds said upper limit threshold.

14. The apparatus according to claim 12, further comprising:

an underfrequency detecting circuit, wherein said digital signal F(ω) is fed to underfrequency detecting circuit, wherein said underfrequency detecting circuit stores a lower limit threshold and outputs an operation command to raise the frequency of said AC electric voltage of said electric power system when the digital signal F(ω) is less than said lower limit threshold.

15. The apparatus according to claim 11, further comprising:

an overfrequency detecting circuit, wherein the input/output interface circuit outputs the digital signals E1 and E2 to said overfrequency detecting circuit, wherein said overfrequency detecting circuit receives the digital signals E1 and E2, compares the digital signal E2 with a value $(\omega k)^2 \cdot E1$ which is obtained by multiplying said digital signal E1 by $(\omega k)^2$, where ω is a fundamental frequency of the AC electric voltage of the electric power system and k is a coefficient, and determines that the AC electricity has an excessively high frequency when the value of $(\omega k)^2 \cdot E1$ is lower than E2, whereupon said overfrequency detecting circuit outputs a signal indicative of said determination.

16. The apparatus according to claim 11, further comprising:

an underfrequency detecting circuit, wherein the input/output interface circuit outputs the digital signals E1 and E2 to said underfrequency detecting circuit, and said underfrequency detecting circuit receives the digital signals E1 and E2 and compares the digital signal E2 with a value $(\omega h)^2 \cdot E1$ obtained by multiplying said digital signal E1 by $(\omega h)^2$, where $\omega$ is a fundamental frequency of the AC electric voltage of the power system and h is a coefficient, and determines that the frequency of the AC electricity is excessively low when the value $(\omega h)^2 \cdot E1$ is larger than E2, whereupon said underfrequency detecting circuit outputs a signal indicative of said determination.

17. A protective relay apparatus which operates when a frequency of AC electric voltage of an electric power system exceeds a predetermined frequency, comprising:

frequency detecting means for detecting the frequency of said AC electric voltage of the electric power system wherein the frequency is represented by a digital signal $F(\omega)$;

relay operating determination means for comparing the frequency detected by the frequency detecting means with the predetermined frequency to thereby perform a relay operation; and an input/output interface circuit for outputting a trip signal to a circuit breaker incorporated in the electric power system when the relay operating determination means has outputted an operation determination signal;

and wherein said frequency detecting means includes:

sampling means for sampling the AC electric voltage from said electric power system at a predetermined period T to obtain a sampled analog signal;

an A/D converter for converting the sampled analog signal to a digital signal v;

a first memory means for storing the digital signal v at each sampling time;

a processing unit for executing the following steps 1)–7) in accordance with a program stored in a second memory means, thereby detecting the frequency of the AC electricity on the basis of the digital signal v:

1) reading from the first memory means a digital signal $v_m$ representing the digital signal v at a sampling time $t_m$ and a digital signal $v_{m-n}$ representing the digital signal v at a sampling time $t_{m-n}$ where $t_m = t_{m-n} + nT$;

2) summing the digital signals $v_m$ and $v_{m-n}$ to obtain the digital signal $w_m$;

3) reading from the first memory means a digital signal $v_{m+l}$ representing the digital signal v sampled at a sampling time $t_{m+l}$ and a digital signal $v_{m-l-n}$ representing the digital signal v sampled at a sampling time $t_{m-l-n}$ where $t_{m+l} = t_{m-l-n} + (2l+n)T$;

4) determining a difference between the digital signals $v_{m+l}$ and $v_{m-l-n}$ to obtain a digital signal $u_m$;

5) converting said digital signal $w_m$ to a digital signal E1 representing a first effective value thereof;

6) converting said digital signal $u_m$ to a digital signal E2 representing a second effective value thereof; and 7) detecting a frequency of the AC electric voltage on the basis of dividing said digital signals E1 and E2.

18. The protective relay apparatus according to claim 17, wherein the step 4) calculates the digital signal $u_m$ using the following equation:

$$u_m = \Sigma kl \, (v_{m+l} - v_{m-l-n})$$

where kl represents an approximation coefficient and l a differential correction value.

19. The protective relay apparatus according to claim 17, wherein said relay operating determination means compares said digital signal $F(\omega)$ with an upper limit threshold, and executes the relay operation for the detection of an overfrequency and outputs a relay operation signal when the digital signal $F(\omega)$ exceeds the upper limit threshold.

20. The protective relay apparatus according to claim 17, wherein said relay operating determination means compares said digital signal $F(\omega)$ with a lower limit threshold, and executes the relay operation for the detection of an underfrequency and outputs a relay operation signal when the digital signal $F(\omega)$ is less than the lower limit threshold.

21. The protective relay apparatus according to claim 17, wherein said relay operating determination means compares a value obtained by multiplying said digital signal E1 by a constant with said digital signal E2, and determines that the AC electric voltage has an excessively high frequency when said value is less than the digital signal E2, whereupon said relay operating determination means outputs a relay operation signal indicative of said determination.

22. The protective relay apparatus according to claim 17, wherein said relay operating determination means compares a value obtained by multiplying said digital signal E1 by a constant with said digital signal E2, and determines that the AC electric voltage has an excessively low frequency when said value is larger than the digital signal E2, whereupon said relay operating determination means outputs a relay operation signal indicative of said determination.

\* \* \* \* \*